US006794673B2

(12) United States Patent
Gosain et al.

(10) Patent No.: US 6,794,673 B2
(45) Date of Patent: Sep. 21, 2004

(54) PLASTIC SUBSTRATE FOR A SEMICONDUCTOR THIN FILM

(75) Inventors: Dharam Pal Gosain, Kanagawa (JP); Jonathan Westwater, Kanagawa (JP); Miyako Nakagoe, Kanagawa (JP); Setsuo Usui, Kanagawa (JP); Kazumasa Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/011,736

(22) Filed: Dec. 11, 2001

(65) Prior Publication Data

US 2002/0068390 A1 Jun. 6, 2002

Related U.S. Application Data

(62) Division of application No. 09/116,119, filed on Jul. 16, 1998, now Pat. No. 6,376,290.

(30) Foreign Application Priority Data

Jul. 16, 1997 (JP) .......................................... P09-191538
Jan. 23, 1998 (JP) .......................................... P10-011496

(51) Int. Cl.[7] .............................................. H01L 29/06
(52) U.S. Cl. .......................................... 257/22; 257/25
(58) Field of Search ............................ 257/22, 25, 347; 438/158

(56) References Cited

U.S. PATENT DOCUMENTS 5,024,968 A 6/1991 Engelsberg
5,114,556 A 5/1992 Lamont, Jr.
5,313,075 A 5/1994 Zhang et al.
5,624,873 A 4/1997 Fonash et al.
5,757,456 A 5/1998 Yamazaki et al.
5,817,550 A 10/1998 Carey et al.
5,834,327 A 11/1998 Yamazaki et al.
5,953,595 A * 9/1999 Gosain et al. ............... 438/158
5,958,268 A 9/1999 Engelsberg et al.

OTHER PUBLICATIONS

"Handbook of Vacuum Science and Technology" ed. Dorothy M. Hoffman, Academic Press, San Diego, CA, 1998, pp. 451–452,484,488 and 502.*

Tam et al., "Laser–cleaning techniques for removal of surface particulates," Journal of Applied Physics, (7), Apr. 1992, pp. 3515–3523.

* cited by examiner

*Primary Examiner*—W. David Coleman
(74) *Attorney, Agent, or Firm*—Sonnenschein, Nath & Rosenthal LLP

(57) ABSTRACT

An amorphous silicon thin film includes a plastic substrate as a base, and insulating layers are formed thereon each radiated with a pulse laser beam which removes volatile contaminants like a resist as a pretreatment. A protective layer including a gas barrier layer and a refractory buffer layer is formed on the substrate. Gas penetration from the substrate to the amorphous silicon film is thereby prevented. Conduction of heat produced by energy beam radiation to the substrate is prevented as well. it is possible to increase energy intensity of energy beam radiated for the polycrystallization of the amorphous silicon film to the optimal value for perfect polycrystallization.

5 Claims, 7 Drawing Sheets

PLASTIC SUBSTRATE FOR A SEMICONDUCTOR THIN FILM

CROSS-REFERENCES TO RELATED APPLICATIONS

This application is a divisional of U.S. application Ser. No. 09/116,119, filed Jul. 16, 1998, now U.S. Pat. No. 6,376,290 entitled "Method of Forming Semiconductor Thin Film and Plastic Substrate."

BACKGROUND OF THE INVENTION

1. Field of the Invention

The present invention relates to a method of forming a semiconductor thin film including a process of cleaning a surface of a semiconductor substrate or an insulating substrate made of glass, plastic and the like, or a surface of a thin film formed an such a substrate. In particular, the invention relates to a method of forming a semiconductor thin film wherein polycrystallization of amorphous films is performed through energy beam radiation as in a step of manufacturing thin film transistors (TFT) used in liquid crystal displays (LCD) and so on. The invention further relates to a plastic substrate applied to the method.

2. Description of the Related Art

A TFT is used as a device having a switching function in a TFT liquid crystal display. The TFT is formed on a substrate, corresponding to each pixel of the liquid crystal display. TFTs made of amorphous silicon (Si) and those made of polycrystalline silicon are available. A high quality polysilicon TFT is fabricated on a substrate at a low temperature through crystallization of an amorphous silicon by radiating an energy beam such as an excimer laser, in particular. A pixel switching device and periphery circuitry of a liquid crystal display is formed on a single substrate, using such a poly-silicon TFT. A TFT having a bottom gate structure has to be vaporized through energy beam radiation. The amorphous silicon film may be thereby partially damaged.

Such volatile contaminants include water absorbed by a substrate surface or a surface of thin film formed on a substrate exposed to the atmosphere in a device fabrication process and organic substances such as residual fragments of resist when etching is performed with a resist mask and dirt deposited during handling of a substrate. If such volatile contaminants are vaporized and a gas thereby released builds up between the thin film (amorphous silicon film) and the base, the thin film may be lifted off.

In order to prevent such damage to the amorphous silicon film, the energy value of an energy beam for radiation could be reduced to a value lower than the optimum value for polycrystallization. However, the crystal thereby obtained is imperfect and not fully polycrystallized.

Besides glass, a substrate used for such a TFT may be a plastic. However, since a plastic substrate has low heat resistance, heat generated through energy beam radiation affects the substrate and causes a deformation of the substrate and so on. It is therefore impossible to radiate the optimum energy beam and to obtain a perfect crystal.

It is a first object of the invention to provide a method of forming a semiconductor thin film which is free from damage to the film and a substrate deformation with radiation of optimum energy beam for perfect crystallization.

It is a second object of the invention to provide a plastic substrate optimal for fabrication of such a semiconductor thin film.

A method of forming a semiconductor thin film of the invention includes the steps of: removing contaminants deposited on a surface of a base layer on which the semiconductor thin film is formed, through pulse laser beam radiation; forming the semiconductor thin film on the surface of the base layer free of the contaminants; and crystallizing the semiconductor thin film.

Another method of forming a semiconductor thin film of the invention includes the steps of: removing contaminants deposited on a substrate through pulse laser beam radiation; forming a gate electrode pattern on the substrate free of the contaminants; removing contaminants deposited on a surface of the gate electrode pattern through pulse laser beam radiation; forming an insulating layer on the gate electrode pattern; removing contaminants deposited on a surface of the insulating layer through pulse laser beam radiation; forming the semiconductor thin film on the insulating layer free of the contaminants; forming a source region and a drain region by selectively introducing impurities to the semiconductor thin film; and crystallizing the semiconductor thin film through energy beam radiation.

Still another method of forming a semiconductor thin film of the invention includes the steps of: forming a gas barrier layer for preventing penetration of a gas on a surface of a plastic substrate; forming a refractory buffer layer for preventing heat conduction on the gas barrier layer; forming the semiconductor thin film on the refractory buffer layer; and performing heat treatment of the semiconductor thin film through energy beam radiation.

A plastic substrate of the invention comprises a protective layer on a surface thereof. The protective layer includes a gas barrier layer having a function of preventing penetration of a gas and a refractory buffer layer of 1 $\mu$m or above in thickness having a function of preventing heat conduction.

In the method of forming a semiconductor thin film of the invention, volatile contaminants are removed through radiating the base layer with a pulse laser beam whose wavelength is 100 to 350 nm, for example, as a pretreatment. Damage to the film due to vaporized contaminants deposited on the base layer surface is thereby prevented. As a result, the energy beam of the value optimal for polycrystallization is applicable in the step of crystallizing the semiconductor thin film In the other method of the invention, the refractory buffer layer between the plastic substrate and the semiconductor film prevents heat produced through energy beam radiation from affecting the plastic substrate. The gas barrier layer prevents penetration of a gas from the plastic substrate to the semiconductor film.

The plastic substrate of the invention comprises the protective layer including the gas barrier layer and the refractory buffer layer. As a result, it is possible that the semiconductor film is radiated with an energy beam of the optimal energy value.

Other and further objects, features and advantages of the invention will appear more fully from the following description.

DETAILED DESCRIPTION OF THE PREFERRED EMBODIMENT

A preferred embodiment of the invention will now be described in detail with reference to the accompanying drawings. The invention applied to a method of manufacturing a thin film transistor will be described.

Figure 1A:
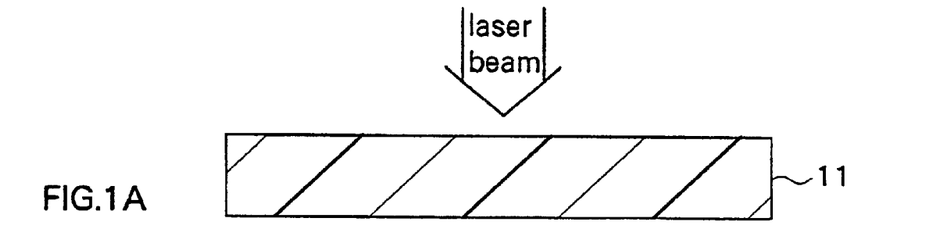
FIG. 1A, FIG. 1B, FIG. 1C and FIG. 1D are cross sections for illustrating a method of forming a thin film transistor of an embodiment of the invention.

FIG. 1A to FIG. 1D, FIG. 2A to FIG. 2C and FIG. 3 show a method of forming a thin film transistor of an embodiment of the invention in order of manufacturing step. First, initial cleaning is performed on a surface of a substrate 11 made of plastic having a thickness of 200 $\mu$m, for example, with a neutral detergent and pure water ($H_2O$). Next, as shown in FIG. 1A, the substrate 11 is radiated with a UV pulse laser beam with energy in the range of 50 to 350 $mJ/cm^2$ for removing volatile contaminants such as water and organic substances deposited on the substrate 11. With radiation of the UV pulse beam, water absorbs energy and rapidly rises in temperature. Water then evaporates. Organic substances absorb energy and store up vibration energy. Regular vibrations which are thereby produced by this vibration energy, cause the substances to be discharged from the substrate. (See Andrew C. Tam, Wing P. Leung, Werner Zapta and Winfrid Ziemlich, J. Appl. Phys., 71(1992) p. 3515).

It is preferable to use a short-wavelength excimer laser such as KrF (resonance wavelength of 248 nm), ArF (resonance wavelength of 193 nm) and XeCl (resonance wavelength of 308 nm). The substrate 11 may be made of plastic such as polyether sulfone (PES) and polymethyl methacrylate (PMMA). The embodiment of the invention is particularly effective for a plastic substrate whose softening temperature is 250° C. or below. The embodiment may be applied to a plastic substrate having higher heat resistance. The substrate 11 is not limited to the one made of plastic but may be made of any other material such as quartz ($SiO_2$).

Figure 1B:
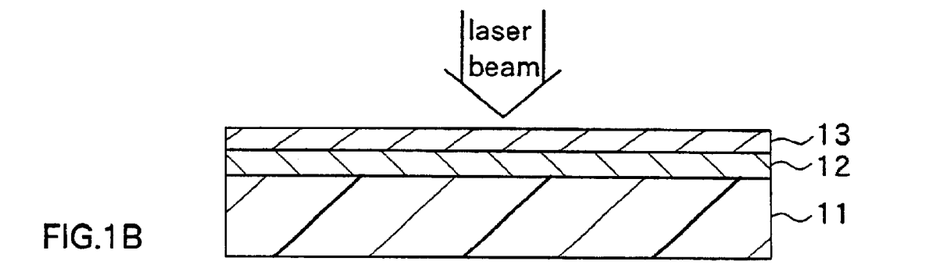

Next, as shown in FIG. 1B, a silicon nitride ($SiN_x$) film of 50 nm in thickness, for example, as a gas barrier layer 12 is formed on the substrate 11. The gas barrier layer 12 is formed through sputtering in a helium (He) atmosphere with an introduction of oxygen ($O_2$), for example. Next, a silicon dioxide ($SiO_2$) film of 1 $\mu$m in thickness, for example, as a refractory buffer layer 13 is formed on the gas barrier layer 12 through physical vapor deposition (PVD). UV pulse laser beam radiation described above may be further performed after the formation of the refractory buffer layer 13. Alternatively, radiation may be performed either before or after the layer formation.

Figure 1C:
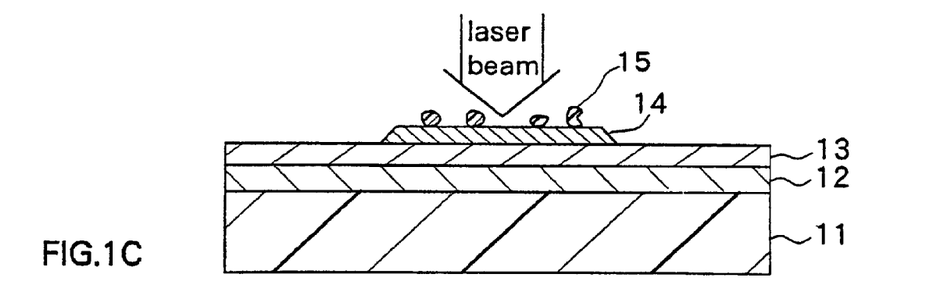

Next, as shown in FIG. 1C, a gate electrode 14 of tantalum (Ta) of 100 nm in thickness, for example, is formed on the refractory buffer layer 13, which has been cleaned. That is, a tantalum film is formed on the refractory buffer layer 13 through sputtering, for example. A photoresist film is then formed on the tantalum film. The photoresist film is patterned and the tantalum film is etches with the photoresist film as a mask. The resist film is then lifted off so as to form the pattern of the gate electrode 14. Next, the surface of the gate electrode 14 is cleaned with acetone or pure water. The surface is further radiated with a UV pulse laser beam with energy in the range of 50 to 350 $mJ/cm^2$ for removing fragments 15 of the photoresist.

Figure 1D:
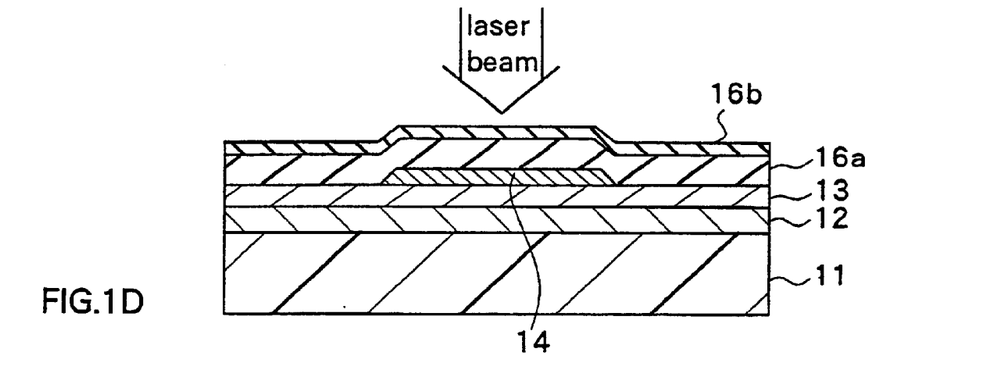

Next, as shown in FIG. 1D, a silicon dioxide film of 100 nm in thickness as an insulator 16a and a silicon nitride film of 50 nm in thickness as an insulator 16b are stacked on the cleaned surface of the gate electrode 14. The insulators 16a and 16b are formed through sputtering in a helium atmosphere. The surface of the insulator 16b is radiated with a UV pulse laser beam for cleaning. The stacked layers of the insulators 16a and 16b function as a gate insulator.

Figure 2A:
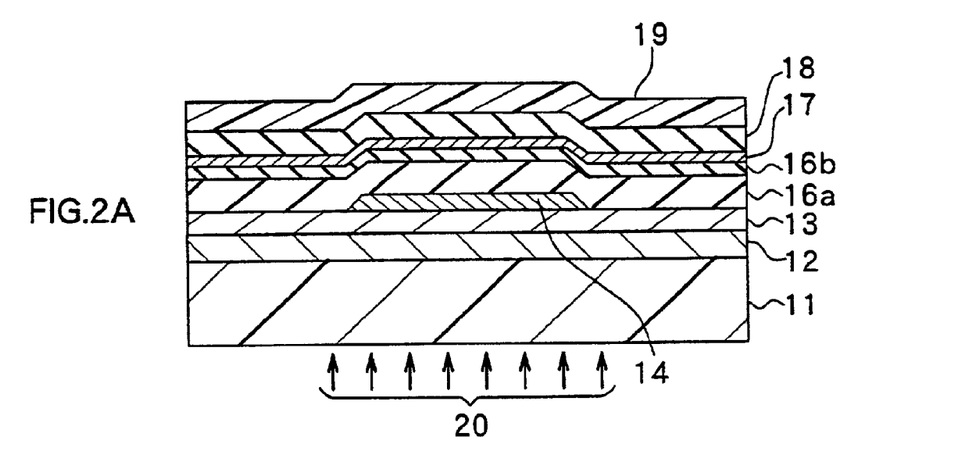
FIG. 2A, FIG. 2B and FIG. 2C are cross sections for illustrating the steps that follow FIG. 1D.

Next, as shown in FIG. 2A, an amorphous silicon film 17 of 30 nm in thickness is formed on the cleaned surface of the insulator 16b through sputtering in a helium atmosphere, for example. On the amorphous silicon film 17, an insulator 18 made of silicon dioxide of 100 nm in thickness is formed through sputtering in a helium atmosphere, for example. A photoresist film 19 is then applied over the surface of the insulator 18. An exposure 20 with a g-line (wavelength of 436 nm) is then performed on the photoresist film 19 from the underside of the substrate 11. With the gate electrode 14 as a mask, the photoresist film 19 having a thickness similar to that of the gate electrode 14 is formed in a self-aligned manner.

Figure 2B:
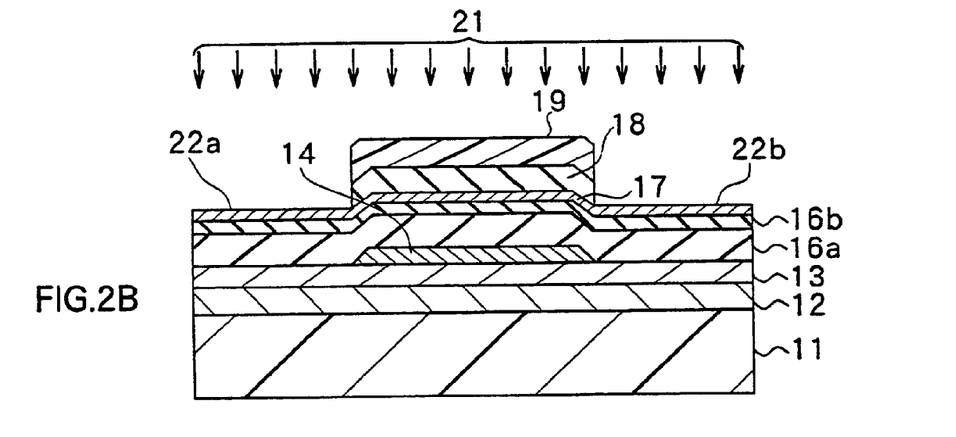
Figure 2C:
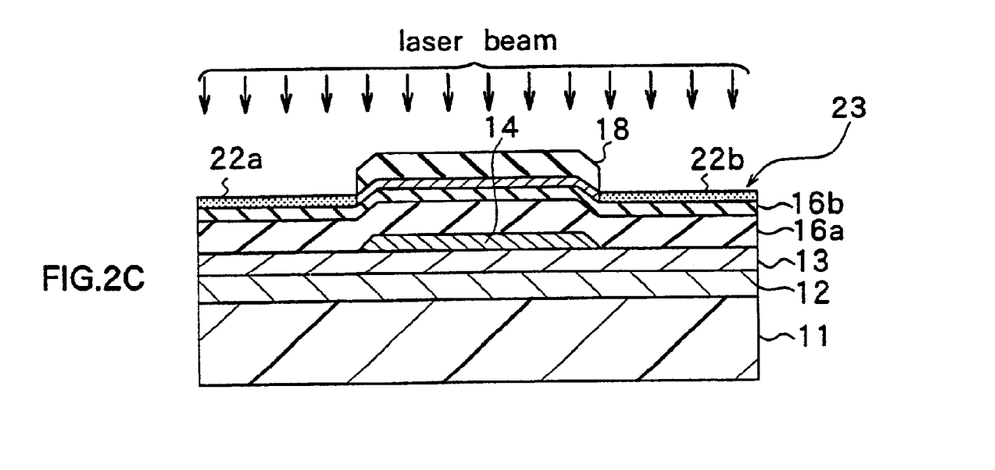

Etching is then performed with the photoresist film 19 as a mask so as to leave the insulator 18, corresponding to the region where the gate electrode 14 is formed only, as shown in FIG. 2B. With the photoresist film as a mask, n-type impurities 21 such as phosphorus (P) are introduced to the amorphous silicon film 17 through ion doping or plasma doping of phosphine ($PH_3$) at a low temperature of 90° C., for example. A source region 22a and a drain region 22b are thereby formed. Next, the photoresist film 19 is lifted off. The substrate surface is then radiated with an excimer laser beam. The amorphous silicon film 17 melts with the excimer laser beam radiation. The molten region is polycrystallized through cooling the substrate down to a room temperature. A poly-silicon film 23 including the source region 22a and the drain region 22b are thereby formed.

In the embodiment, volatile contaminants deposited on the base (the substrate 11) are eliminated through UV pulse laser beam radiation in the stage preceding the step of laser beam radiation for polycrystallization of the amorphous silicon 17. Therefore, no contaminants exist between the substrate 11 and the amorphous silicon 17. As a result, damage to the film caused by a gas that may be produced through vaporization of contaminants is prevented. It is thus possible to increase energy intensity of the laser beam radiated for polycrystallization of the amorphous silicon 17 to the optimal value.

Figure 3:
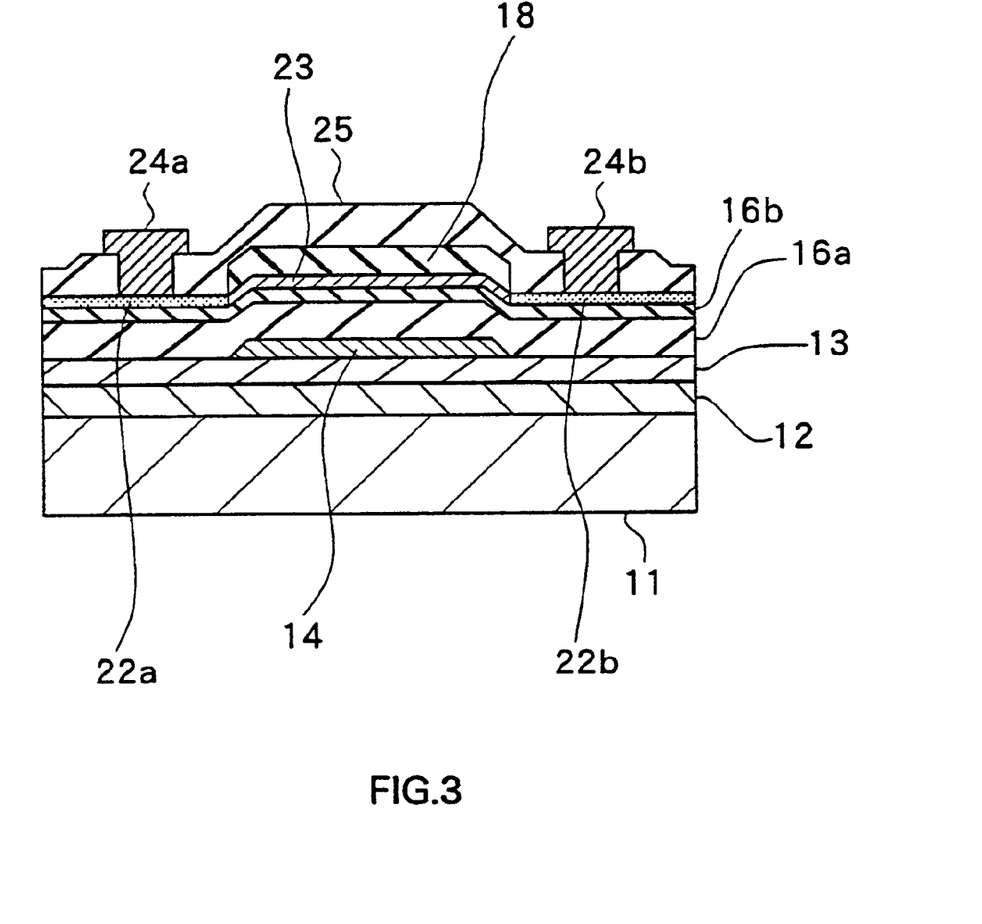
FIG. 3 is a cross section that follows FIG. 2C.

Next, as shown in FIG. 3, dangling bonds are inactivated through hydrogenation of the channel region in the polysilicon film 23 in hydrogen plasma. A silicon nitride film is then formed as a protective layer 25 through sputtering or plasma-enhanced chemical vapor deposition (PECVD). Through excimer laser beam radiation, defects in the polysilicon produced during the plasma hydrogenation are removed. Through the radiation, hydrogenation of the polysilicon is brought to perfection and the hydrogen distribution is homogenized while preventing emission of hydrogen in the poly-silicon. Finally, a source electrode 24a and a drain electrode 24b both of aluminum (Al) are each formed on the source region 22a and the drain region 22b, respectively, in the poly-silicon film 23 through sputtering using an argon (Ar) gas, for example. The thin film transistor is thus completed.

EXAMPLE

An example to which the method of forming a semiconductor thin film of the invention is applied will now be described.

A quartz substrate was utilized in the example. The substrate was radiated with ten pulses of excimer laser beam whose energy (radiation energy for substrate cleaning) is approximately 310 mJ/cm$^2$ for removing volatile contaminants deposited on surfaces of the substrate and a thin film formed on the substrate. On the substrate free of volatile contaminants, a plurality of amorphous silicon films having source and drain regions were provided through the method of forming a thin film transistor described in the foregoing embodiment. For the polycrystallization, the amorphous silicon films were radiated with 100 pulses of the excimer laser beam with a different energy intensity for each film.

Figure 4:
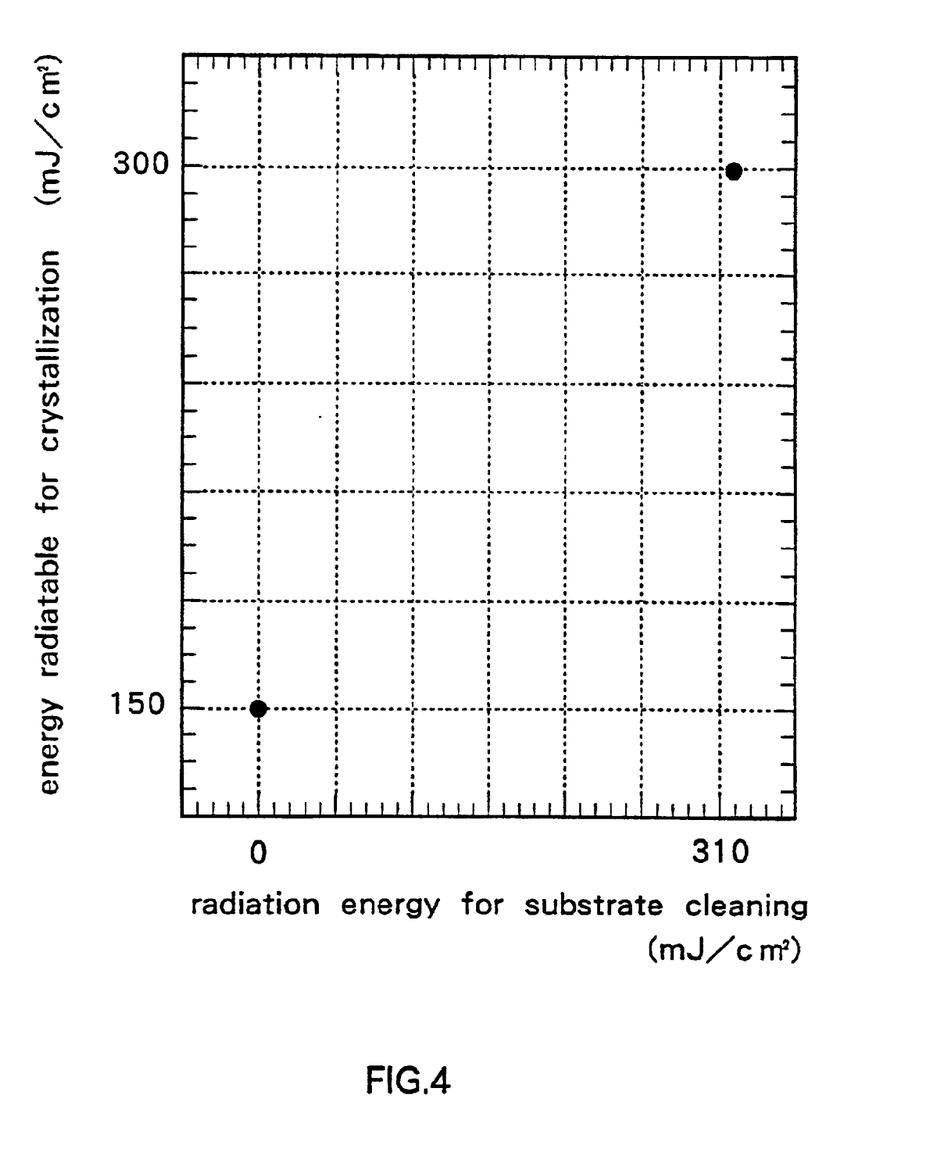
FIG. 4 is a plot for indicating the relationship between radiation energy for substrate cleaning and energy intensity applicable for polycrystallization of a semiconductor film.

The result was that the silicon film was not damaged with the laser beam energy (radiatable energy) of 300 mJ/cm$^2$, as shown in FIG. 4. The energy value of 300 mJ/cm$^2$ is sufficient for achieving perfect polycrystallization of the amorphous silicon film.

As an example to be compared with the above example of the invention, the polycrystallization of amorphous silicon films was performed without removing volatile contaminants deposited on surfaces of the quartz substrate and a thin film formed on the substrate through UV pulse laser beam radiation. That is, the polycrystallization was performed through the method similar to that of the above example except that radiation energy for substrate cleaning was zero. As shown in FIG. 4, the result was that the silicon film was damaged with laser beam energy of more than 150 mJ/cm$^2$.

The example of the invention and the comparison example described so far showed that if the surface of the substrate and so on was cleaned through UV pulse laser beam radiation as a pretreatment, the energy intensity of laser beam radiated for the polycrystallization of the amorphous silicon films was raised to the optimal energy intensity or above required for perfect polycrystallization.

In the method of forming a semiconductor thin film of the embodiment described so far, the base was cleaned through UV pulse laser beam radiation as a pretreatment. Emission of a gas from the base is thereby prevented during formation of the thin film. Consequently, damage to the semiconductor thin film is prevented. In addition, it is possible to radiate an energy beam of the optimal energy intensity for polycrystallization. A high-performance semiconductor thin film of improved quality is thus obtained.

The functions of the refractory buffer layer 13 and the gas barrier layer 12 in the foregoing embodiment will now be described. The layers are particularly effective for the substrate 11 made of plastic whose softening temperature is 250° C. or below.

Figure 5:
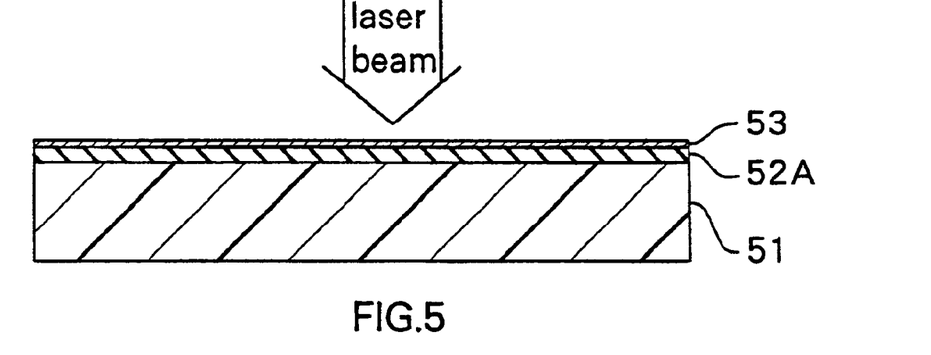
FIG. 5 is a cross section for illustrating a function of a refractory buffer layer.
Figure 6:
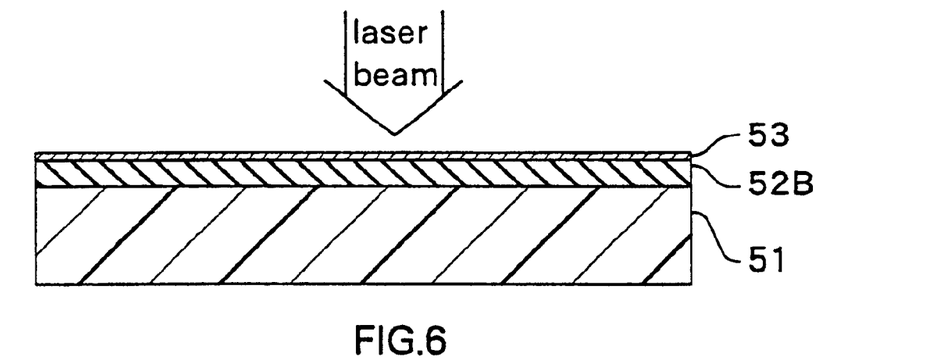
FIG. 6 is a cross section for illustrating a function of a refractory buffer layer.
Figure 7:
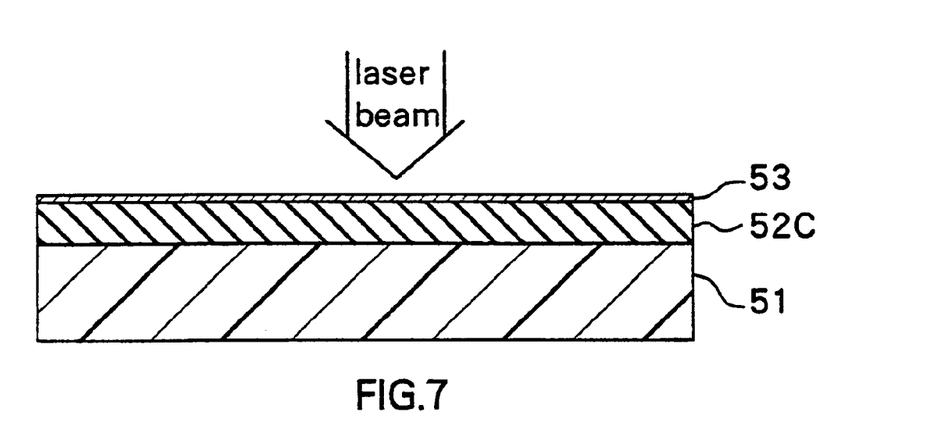
FIG. 7 is a cross section for illustrating a function of a refractory buffer layer.

Referring to FIG. 5 to FIG. 7 and FIG. 8, the relationship between the thickness of the refractory buffer layer 13 and the maximum temperature of the surface of the substrate 11 made of plastic will be described. FIG. 5 shows a plastic substrate 51 made of PMMA of 0.01 mm in thickness on which a refractory buffer layer 52A made of silicon dioxide of 0.5 μm in thickness is formed. An amorphous silicon film 53 of 30 nm in thickness is then formed on the refractory buffer layer 52A. In FIG. 6 a refractory buffer layer 52B of 1.0 μm in thickness is formed instead of the refractory buffer layer 52A shown in FIG. 5. In FIG. 7 a refractory buffer layer 52C of 1.5 μm in thickness is formed.

Figure 8:
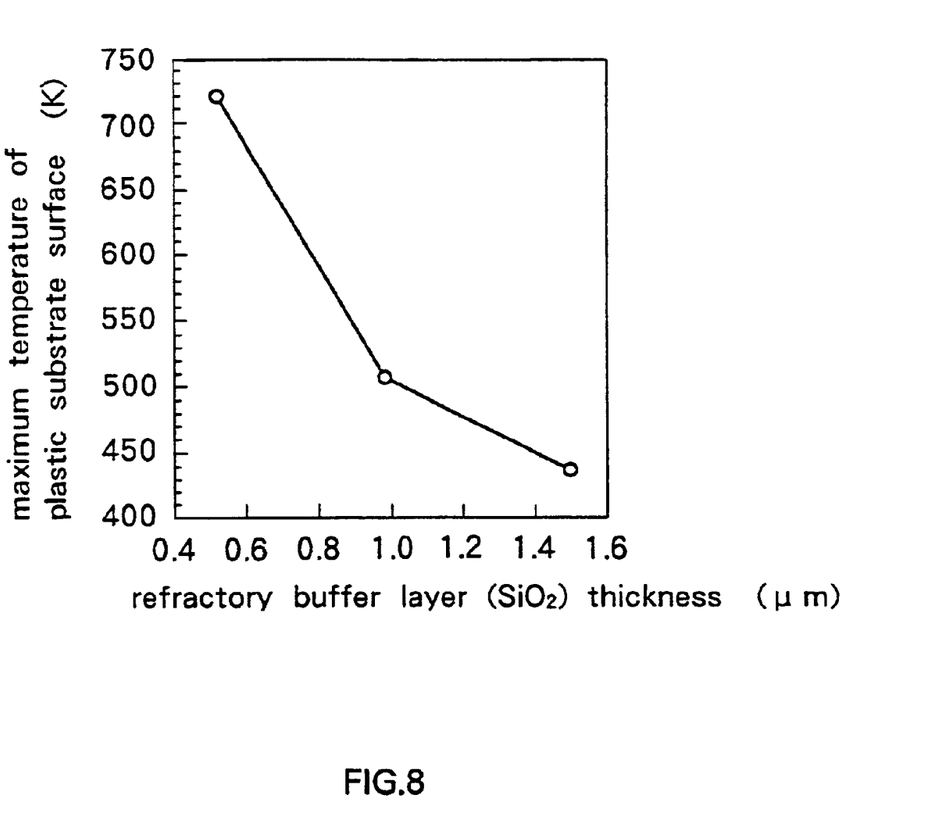
FIG. 8 is a plot for indicating the relationship between the thickness of the refractory buffer layer and a surface temperature (maximum temperature) of a plastic substrate.

FIG. 8 shows the simulation result of temperatures (maximum temperatures) of the interfaces between the substrates 51 and the refractory buffer layers 52A, 52B and 52C, respectively, (that is, the surface of the substrates 51) wherein the amorphous silicon films 53 in FIG. 5 to FIG. 7 are each polycrystallized through excimer laser beam radiation (resonance wavelength of 308 nm) with energy of 200 mJ/cm$^2$. As shown, the temperature of the surface of the substrate 51 increases with a reduction in thickness of the refractory buffer layer.

Figure 9:
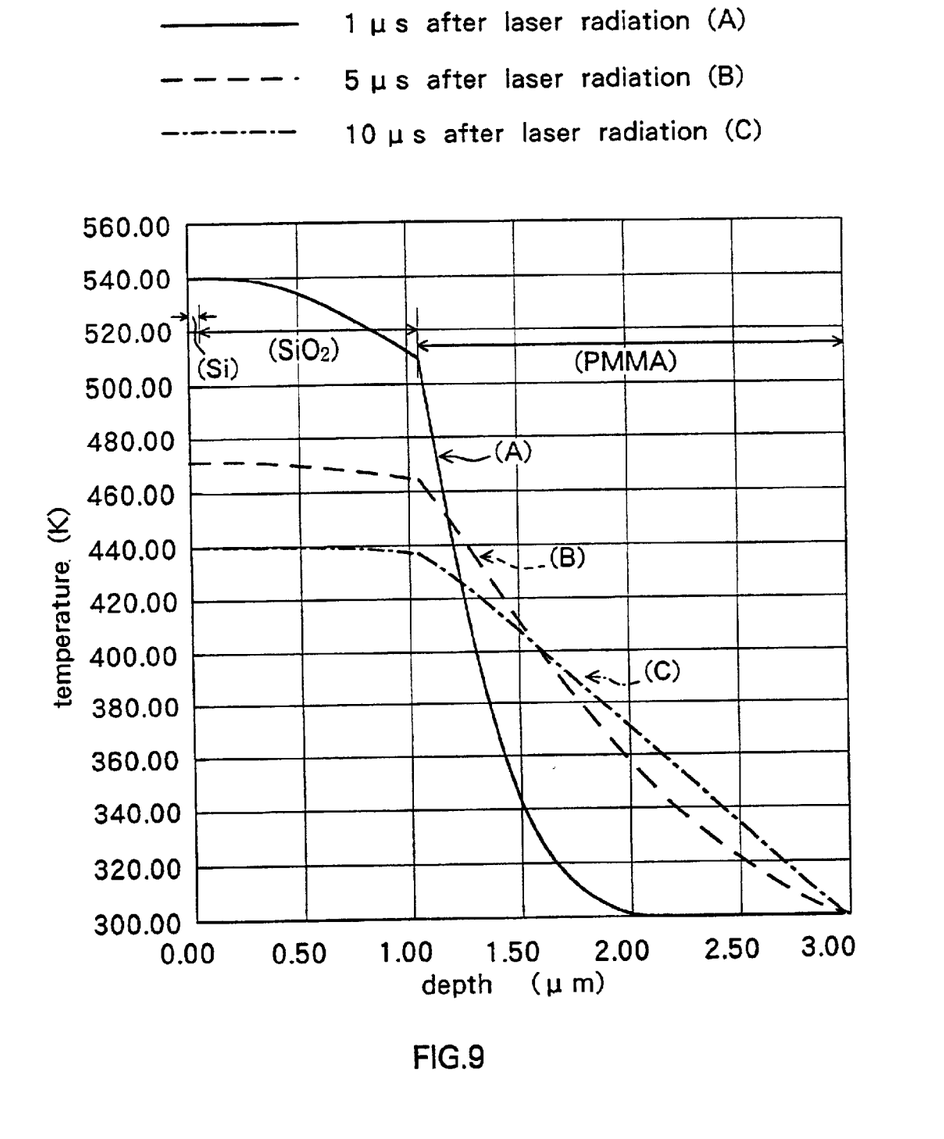
FIG. 9 is a plot for indicating temperature distributions measured after a lapse of specific time at depths from a surface of an amorphous silicon film when excimer laser beam radiation is performed.

FIG. 9 shows temperature distributions measured at depths from the surface of the amorphous silicon film 53 when the refractory buffer layer 52B of 1.0 μm in thickness in FIG. 6 is radiated with an excimer laser beam. The horizontal axis indicates depths while the vertical axis indicates temperatures. The temperature distributions measured after a lapse of specific time are shown. Solid line A indicates the temperature distribution after a lapse of 1 μs after laser radiation. Broken line B indicates the temperature distribution after a lapse of 5 μs. Alternate long and short dash line C indicates the temperature distribution after a lapse of 10 μs.

Two points are evident from the results shown in FIG. 8 and FIG. 9. First, the temperature of the interface between the substrate 51 and the refractory buffer layer 52B rises higher than 100° C., that is, the softening temperature of the plastic (PMMA), if the thickness of the refractory buffer layer (SiO$_2$) is less than 1.0 μm. Secondly, since the temperature distribution abruptly changes in the substrate 51, the temperature affects the thin plastic substrate. Therefore, it is preferable that the thickness of the refractory buffer layer is 1.0 to 2.0 μm.

However, it is difficult to achieve flatness of the refractory buffer layer and the amorphous silicon film if the refractory buffer layer is formed directly on the plastic substrate. In addition, a gas and impurities are often produced from the plastic substrate itself. It is thus required to prevent such a gas from penetrating into the amorphous silicon film. It is therefore preferable to form a gas barrier layer made of dense material such as silicon nitride (SiN) on the plastic substrate so as to provide a two-layer structure with the refractory buffer layer as in the foregoing embodiment.

The total thickness of the refractory buffer layer and the gas barrier layer is preferably thicker at least than the thickness of the amorphous silicon film to be polycrystallized. In the TFT with a bottom gate structure as shown in FIG. 3, for example, the thickness including all of the gas barrier layer 12, the refractory buffer layer 13 and the insulators (gate insulators) 16a and 16b is preferably thicker than the amorphous silicon film. In a TFT with a top gate structure, the thickness including the gas barrier layer 12 and the refractory buffer layer 13 is preferably thicker than the amorphous silicon film.

According to the embodiment of the invention, in addition to the effects previously described, the gas barrier layer 12 placed between the plastic substrate 11 and the amorphous silicon film 17 prevents a gas produced out of the substrate 11 from penetrating into the amorphous silicon film 17. Furthermore, since the refractory buffer layer 13 is placed between the substrate 11 and the amorphous silicon film 17, heat resulting from energy beam radiation does not affect the plastic substrate 11 and cause softening and so on. As a result, the energy beam of the optimal value is applicable for crystallization. A high quality poly-silicon film is thereby achieved.

The present invention is not limited to the foregoing embodiment and the example but may be practiced in still other ways. For example, although UV pulse laser beam radiation for cleaning is performed in each step (FIG. 1A to FIG. 1D), radiation may be omitted in some of the steps. Although the silicon film is described as an amorphous semiconductor thin film in the foregoing embodiment, the invention is applicable to any other film crystallized through energy beam radiation. Although the invention is applied to the method of forming a thin film transistor in the foregoing embodiment, the invention may be applied to a manufacturing process of any other semiconductor device.

In the method of forming a semiconductor thin film of the invention described so far, contaminants deposited on the substrate are removed through radiating the substrate with a pulse laser beam as a pretreatment when the amorphous semiconductor thin film is radiated with an energy beam for polycrystallization. Emission of a gas resulting from volatile contaminants is thereby prevented. It is thus possible to polycrystallize the thin film through radiating an energy beam of the optimal energy value. Consequently, damage to the thin film is prevented. Quality of the film is thereby improved. A process margin is increased as well.

In the other method of the invention, the stacked layers including the gas barrier layer for preventing gas penetration and the refractory buffer layer for preventing heat conduction are provided on the plastic substrate surface. The refractory buffer layer between the plastic substrate and the amorphous semiconductor film prevents heat produced through energy beam radiation from affecting the plastic substrate. The gas barrier layer prevents penetration of a gas from the plastic substrate to the semiconductor film. It is therefore possible to radiate an energy beam of the optimal energy value for polycrystallization. Quality of the film is thereby improved. A process margin is increased as well.

The plastic substrate of the invention comprises the protective layer including the gas barrier layer and the refractory buffer layer. As a result, it is possible that the amorphous semiconductor film is radiated with an energy beam of the optimal energy value.

Obviously many modifications and variations of the present invention are possible in the light of the above teachings. It is therefore to be understood that within the scope of the appended claims the invention may be practiced otherwise than as specifically described.

What is claimed is:

1. A plastic substrate structure on which thin film transistor are formed comprising:
    a plastic substrate; and
    a protective layer disposed on said plastic substrate, said protective layer including:
        a gas barrier layer of silicon nitride disposed directly on said plastic substrate; and
        a refractory buffer layer of silicon dioxide disposed on said gas barrier layer.

2. The substrate structure of claim 1, wherein said gas barrier layer is 50 nm in thickness.

3. The substrate structure of claim 1, wherein said refractory buffer layer is 1 μm in thickness.

4. The substrate structure of claim 1 further comprising:
    a gate electrode disposed on said protective layer; and
    a gate insulator disposed on said gate electrode, said gate insulator including:
        a first insulator of silicon dioxide film disposed on said gate electrode; and
        a second insulator of silicon nitride film disposed on said first insulator.

5. The substrate structure of claim 1 wherein said protective layer is disposed between said plastic substrate and the thin film transistors formed on said plastic substrate.

* * * * *